(12) United States Patent
Poulis et al.

(10) Patent No.: US 6,338,077 B1
(45) Date of Patent: Jan. 8, 2002

(54) TRANSFER FUNCTION IMPLEMENTATION USING DIGITAL IMPEDANCE SYNTHESIS

(75) Inventors: Spiro Poulis, Kearns; John Evans, Riverton; Shayne Messerly, Farmington, all of UT (US)

(73) Assignee: 3Com Corporation, Santa Clara, CA (US)

( * ) Notice: Subject to any disclaimer, the term of this patent is extended or adjusted under 35 U.S.C. 154(b) by 0 days.

(21) Appl. No.: 09/321,899

(22) Filed: May 28, 1999

(51) Int. Cl.[7] .............................. G06J 1/00; G06G 7/16
(52) U.S. Cl. ............................................ 708/8; 708/845
(58) Field of Search ...................................... 708/8, 845

(56) References Cited

U.S. PATENT DOCUMENTS

| | | |
|---|---|---|
| 4,056,740 A | * 11/1977 | Schoeff ........................ 327/77 |
| 4,395,590 A | 7/1983 | Pierce et al. |
| 4,661,978 A | * 4/1987 | Hirata ........................ 379/394 |
| 5,181,240 A | 1/1993 | Sakuragi et al. |
| 5,528,131 A | 6/1996 | Marty et al. |
| 5,790,656 A | 8/1998 | Rahamin et al. |
| 5,809,068 A | 9/1998 | Johnson |
| 5,815,567 A | 9/1998 | Davis et al. |
| 6,104,817 A | * 8/2000 | Ding ............................ 381/96 |

* cited by examiner

Primary Examiner—Tan V. Mai
(74) Attorney, Agent, or Firm—Workman, Nydegger & Seeley

(57) ABSTRACT

A system and circuit is provided for digitally synthesizing the impedance of a transfer function. The impedance of the transfer function is digitally synthesized by generating a current that, when combined with an input voltage, results in the impedance of the transfer function. This is accomplished by sensing the input signal and processing it with a generator or multiplier such that a voltage is produced. The produced voltage controls a current source and creates a current having a value equal to the inverse of the transfer function impedance. The sensed or input voltage divided by the generated current is equal to the impedance of the transfer function. In this manner, many different transfer functions can be digitally synthesized without having to design an alternate circuit.

21 Claims, 2 Drawing Sheets

US 6,338,077 B1

TRANSFER FUNCTION IMPLEMENTATION USING DIGITAL IMPEDANCE SYNTHESIS

BACKGROUND OF THE INVENTION

1. Field of the Invention

The present invention relates to transfer functions across an electrical system. More specifically, the present invention relates to digital synthesis of transfer function impedance.

2. Present State of the Art

A transfer function operates on a given input to produce a certain output and is often represented as the ratio of the output to the input. Frequently, differential equations are used to represent or describe not only the input and the output, but also the relationship between them. Solving and representing systems and transfer functions with differential equations involves a complicated mathematical analysis and is, in general, not very satisfactory. For that reason, transfer functions are often designed and analyzed using Laplace transforms of the input, the output and the transfer function.

The Laplace transform significantly simplifies the analysis of a transfer function because the system input and output can be algebraicly manipulated. Similarly, the ratio of the output to the input, or the transform function, can also be altered using algebraic principles. After the transform function has been analyzed in the Laplace domain, it is converted to the time domain in many instances. In many systems, including electrical, mechanical, and electro mechanical systems, the transfer function is found by providing an input, measuring the output, and calculating the ratio of the output to the input. In other circumstances, the transfer function is known, and only the physical implementation of the transfer function needs to be designed. In either case, this analysis is typically performed in the Laplace domain using Laplace transforms.

While a transfer function may be found mathematically, the actual or physical implementation of the transfer function is quite different. With regard to electrical systems, a transfer function represents the effect that a combination of electrical circuit elements such as capacitors, inductors and resistors has on an input signal. When these elements are inserted into a circuit, their effect is to create an impedance which acts upon the input signal to produce the output signal.

Once a transfer function has been physically implemented with the circuit elements, however, there are several limitations. For instance, if a different output is desired or it is discovered that the current implementation of the transfer function is incorrect or inadequate, then a new circuit which does implement the desired transfer function has to be designed. This entails additional cost and time. Also, the resistors, capacitors and inductors used to construct the circuit require physical space, which can be crucial in some electrical applications such as PCMCIA compliant network and modem cards. Further, many circuit elements are manufactured such that resistance, capacitance or inductance is within specified tolerances. As a result, the transfer function implemented with passive circuit elements may not be sufficiently accurate due to the tolerances of the circuit elements. Accuracy can, of course, be improved with items such as precision resistors, but extra precision increases the cost of the circuit substantially in some instances.

It is therefore desirable to have as circuit which not only increases the accuracy of the transform function, but also is able to implement additional transform functions or alter the current transform function without additional circuitry and without additional design.

OBJECTS AND SUMMARY OF THE INVENTION

It is therefore an object of one embodiment of the present invention to digitally synthesize an impedance.

It is yet another object of one embodiment of the present invention to digitally convert an input signal to an output signal.

It is a further object of one embodiment of the present invention to synthesize an impedance representative of a transfer function.

It is another object of one embodiment of the present invention to be able to synthesize an impedance of more than one transfer function.

It is a further object of one embodiment of the present invention to generate a current having a value related to the impedance of the transfer function.

In summary, a transfer function is described as the ratio of an output to an input. In electrical circuitry, the transfer function is frequently defined in terms of an output voltage related to an input voltage. Often the transfer function is known and only the circuitry representing the transfer function needs to be designed. This circuitry is subject to component tolerances, and must be redesigned for each separate transfer function.

A transfer function has an impedance which can be represented as a shunt impedance across the output. In one embodiment of the present invention, an input voltage is sensed and a current is generated which is related to the sensed voltage such that the impedance of the transfer function is present as defined by the sensed voltage divided by the generated current. The impedance of the transfer function is created by converting the sensed voltage to a digital value and then processing it with a generator that produces a voltage that is related to the desired impedance. The generator is implemented in software and uses the impedance of the transform function to alter the sensed voltage. This voltage produced by the generator is converted to an analog voltage and connected to a voltage controlled current source. The generator causes the voltage controlled current source to produce a current having the inverse value of the transform function impedance. In this manner, a shunt current is generated. The shunt current has a value equal to the inverse of the impedance of the transfer function and by Ohm's law, the impedance created by the circuitry of this embodiment has a value equivalent to the impedance of the transfer function. In this manner, the impedance of a transfer function is digitally synthesized.

The advantages of this design are several. The circuitry has no circuit elements in series between the input and the output and direct current voltage drops are therefore not present. Additionally, many different transfer functions can be digitally synthesized by using a different generator. Also, many systems already have many of the circuit components necessary to perform the impedance synthesis, including processors, ADCs and DACs. In this manner, cost is minimized and circuit board space is preserved.

Additional objects and advantages of the present invention will be set forth in the description which follows, and in part will be obvious from the description, or may be learned by the practice of the invention. The objects and advantages of the invention may be realized and obtained by means of the instruments and combinations particularly pointed out in the appended claims. These and other objects and features of the present invention will become more fully apparent from the following description and appended

BRIEF DESCRIPTION OF THE DRAWINGS

In order that the manner in which the above-recited and other advantages and objects of the invention are obtained, a more particular description of the invention briefly described above will be rendered by reference to specific embodiments thereof which are illustrated in the appended drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION OF THE PREFERRED EMBODIMENTS

The present invention implements transfer functions by digitally synthesizing the impedance of a transfer function. In many systems a network or other arrangement of circuit elements is needed to effectuate a particular transform function. However, each system of circuit elements can be represented as having a particular impedance and, as defined by Ohm's law, that impedance may be related to a current and a voltage. Digital impedance synthesis eliminates the necessity of conventional circuit elements such as resistors, capacitors and inductors previously needed to implement a transfer function. The impedance of the transfer function is created by generating a current that has a value related to the impedance of the transfer function. In this manner, a plurality of transfer functions can be implemented with a single circuit by adjusting the value of the generated current such that it relates to the impedance of the desired transfer function.

Figure 1:
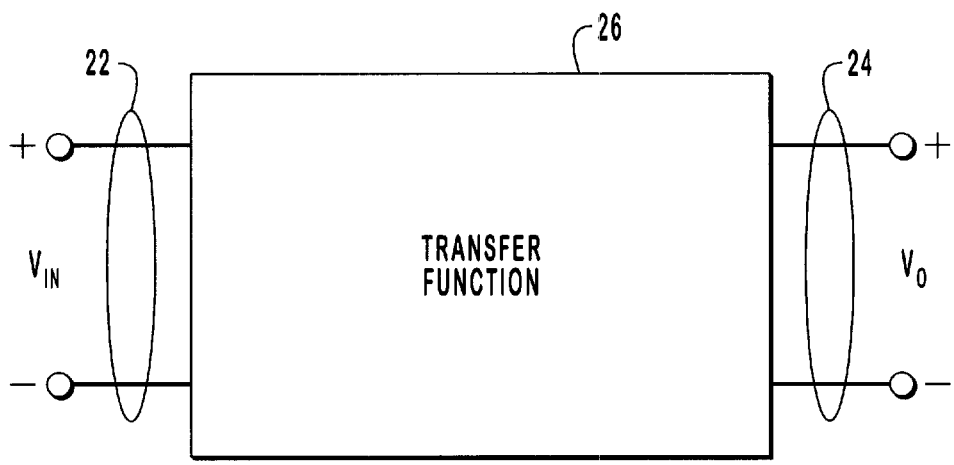
FIG. 1 is a block diagram of a transfer function which converts an input voltage to an output voltage according to the transfer function.

In many instances, it is necessary to convert an input voltage or current to an output voltage or current. The present invention is described in terms of a transform function converting an input voltage to an output voltage, but may be applied to currents as well as systems converting a voltage to a current or a current to a voltage. FIG. 1 is a functional block diagram illustrating the implementation of a transfer function in an electrical environment. Transfer function 26, as illustrated has an input 22 and an output 24. Transfer function operates on input 22 to produce output 24. Input 22, as illustrated in FIG. 1, is received by a terminal pair to which a system or source providing input 22 may be connected. Output 24 is illustrated as being produced on a terminal pair, but need not connect to a system or circuit, although it may. Input 22 is usually a voltage, but may also be a current. Input 22 is depicted having a voltage $V_{in}$, in this embodiment. Likewise, output 24 is depicted having a voltage, but may also be a current and is illustrated as $V_o$. Typically, if input 22 is a voltage, then output 24 is also a voltage. It is possible, however, for input 22 to be a voltage and output 24 to be a current and vice versa.

Transfer function 26 converts input 22 into output 24 and is usually described as the ratio of output 24 over input 22. Another way of viewing transfer function 26 is as a multiplier. In other words, input 22 multiplied by transfer function 26 equals output 24. By altering transfer function 26, a variety of different outputs can be obtained for a particular input. If a particular output is desired for a particular input, then the transfer function must be designed such that this result is produced.

Figure 2:
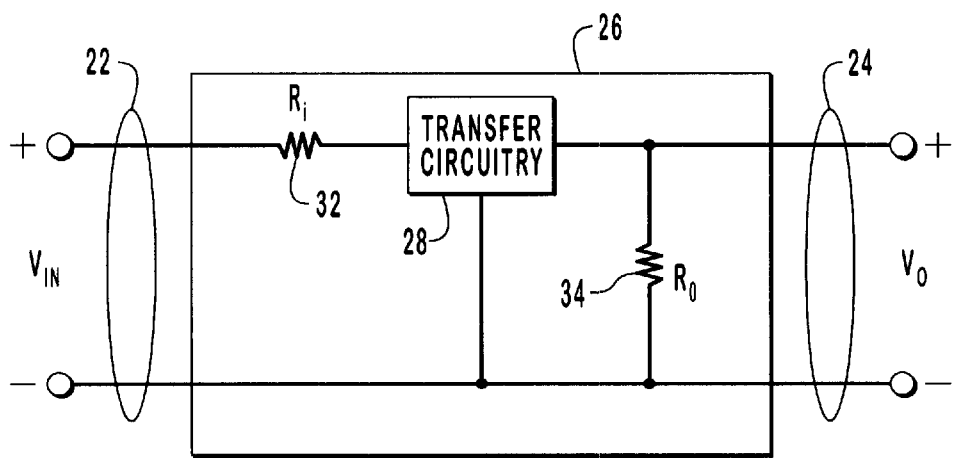
FIG. 2 is a block diagram detailing the actual implementation of a transfer function with circuit elements.

FIG. 2 is a block diagram further illustrating transfer function 26. Transfer function 26 comprises an input resistance $R_i$ 32 and an output resistance $R_o$ 34, and transfer circuitry 28. Transfer circuitry 28 converts input 22 to output 24 and comprises the circuit elements necessary to perform the conversion. For example, if an output voltage having one half the value of an input voltage is desired, then the transfer function multiplies the input by a factor of one half. In other words, the transfer function H is described as follows:

$$H = V_o/V_{in} = \tfrac{1}{2} \quad (1)$$

or $$(V_{in})(H) = V_o. \quad (2)$$

One embodiment of the actual circuit elements which would implement the desired outcome is a voltage divider which comprises a network of resistors. In this manner, transfer function 26 can produce output 24 which is related to input 22. As illustrated in this example, passive circuit elements are typically used to implement transfer functions. However, if a different output is required, then the circuitry comprising the transfer function must be physically altered and redesigned.

Transfer circuitry 28 can be any combination of passive circuit elements including resistors, capacitors and inductors. These passive circuit elements can be arranged in any configuration including series, parallel, shunt and ladder type configurations. Transfer circuitry 28 is not, however, limited to passive circuit elements, but may comprise transistors, operational amplifiers and other electrical devices. Usually, however, these electrical devices can be modeled as a combination of resistors, capacitors and inductors.

Figure 3:
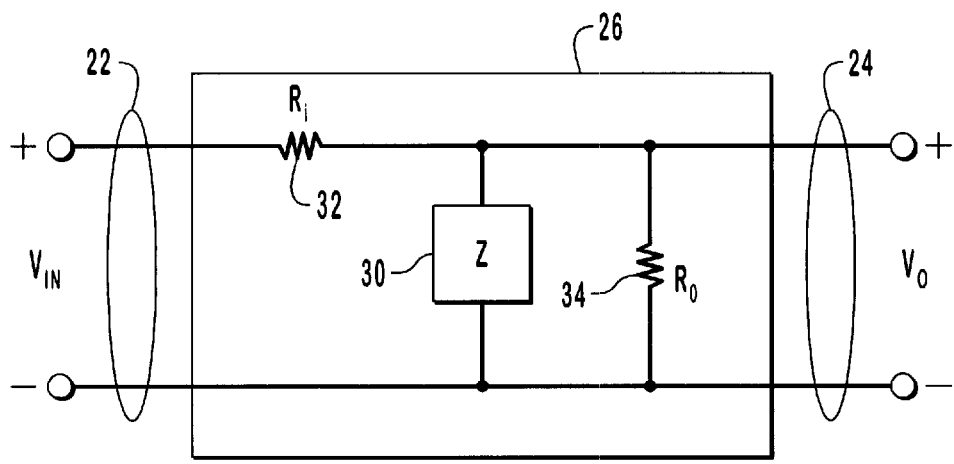
FIG. 3 is a block diagram illustrating the impedance created by the circuitry of the transfer function.

As described, using passive circuit elements requires circuit board space and can only implement one transfer function. The circuitry which makes up transfer circuitry 28 represents some impedance Z 30, as illustrated in FIG. 3. Because transfer circuitry 28 (shown in FIG. 2), has an impedance Z 30, input 22, output 24 and impedance Z 30 may be expressed as rational polynomials using Laplace transforms as follows:

$$V_o = V_{in} * [Z/(2*Z + R_i)]. \quad (3)$$

The combination of equations (2) and (3) thereby defines impedance Z 30 in terms of transfer function 26 (illustrated in FIG. 1) as follows:

$$Z = R_i * [H/(1-2H)] \quad (4)$$

where H is the mathematical representation of transfer function 26 or more specifically, transfer circuitry 28. Once the impedance is expressed in terms of the transfer function, the impedance may be synthesized without the use of transfer circuitry 28.

Figure 4:
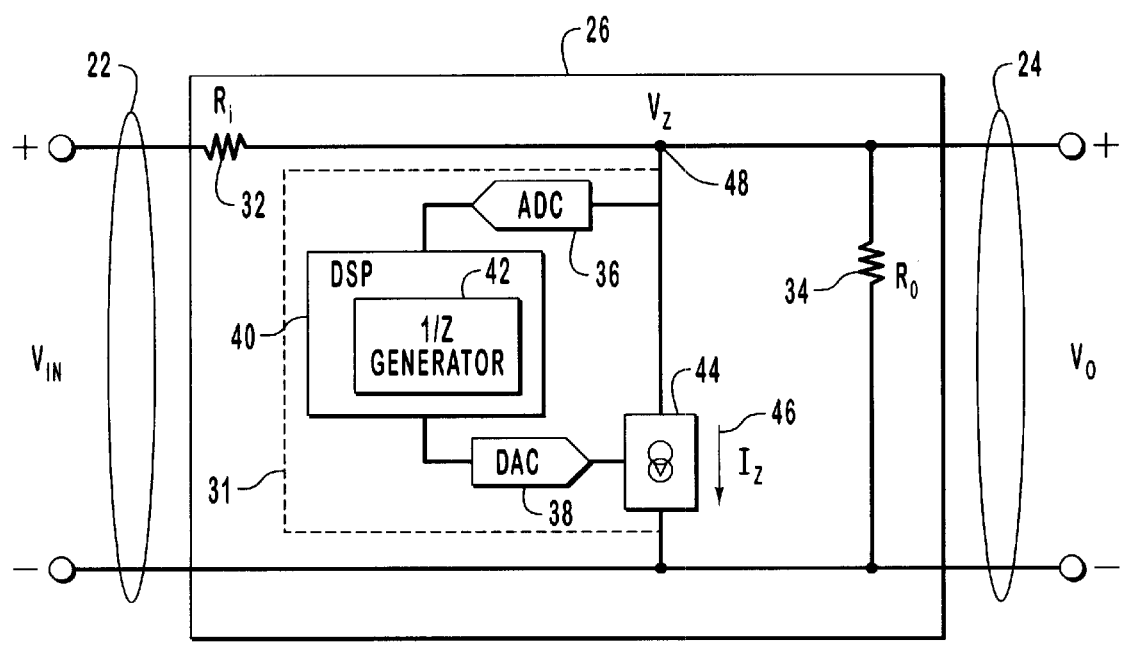
FIG. 4 is a detailed block diagram and schematic of a digital synthesis circuit for synthesizing the impedance of a transfer function.

FIG. 4 is a detailed block diagram illustrating the digital synthesis of impedance Z 30 by impedance synthesis circuit 31. Because transfer circuitry 28 (shown in FIG. 2) can be viewed as an impedance 30, there is a corresponding, voltage $V_z$ 48 and a corresponding current $I_z$ 46. By generating a certain current for a given voltage, an impedance is synthesized having the value of the voltage divided by the current. Thus, for every voltage $V_z$ 48, impedance synthesis circuit 31 generates a shunt current $I_z$ 46 having a value of:

$$I_z = V_z(1/Z). \tag{5}$$

Impedance Z 30 is defined by the desired transform function and is therefore usually known. Impedance synthesis circuit 31 generates current $I_z$ 46, which is dependent on the value of impedance Z 30, as follows. Voltage Vz 48 is sensed and converted to a digital voltage with a means for determining the input voltage. Such means for determining the input voltage, by way of example and not limitation, is depicted as an analog to digital converter (ADC) 36. This digital voltage is processed by digital signal processor (DSP) 40, which has one or more means for multiplying the input voltage. By way of example and not limitation, the means for multiplying is depicted as impedance generators 42. Impedance generator 42 is typically implemented in software and as a consequence, many different values of Z can be synthesized by impedance synthesis circuit 31 by using different software procedures. The voltage produced by DSP 40, or the base voltage, is converted to its analog equivalent with a digital to analog converter (DAC) 38. The base voltage controls a voltage to current converter 44, which generates current $I_z$ 46. In other words, DSP 40 generates a voltage that causes voltage to current converter 44 to produce a current having the value approximately equal to the inverse of the impedance of the transfer function, or having a value of $I_z$ 46. In this manner, impedance synthesis circuit 31 generates a shunt current having the value indicated in equation (5) and by Ohm's law, the impedance created by impedance synthesis circuit 31 is:

$$V_z/I_z = V_z/[V_z*(1/Z)] = Z \tag{6}$$

as required by the transfer function. It is possible to incorporate $R_o$ 34 into the synthesis of impedance Z 30 such that the synthesized impedance has a value of impedance Z 30 in parallel with $R_o$ 34.

The digital synthesis of an impedance has several significant advantages. In any system having or incorporating a digital processor, memory, an ADC and a DAC interface, only a voltage to current converter across two terminals is needed in order to synthesize a prescribed transfer function. Second, there are no circuit elements in series between the source resistance $R_i$ and the output voltage, which can be important in circuit topologies which do not tolerate small direct current voltage drops. Third, the digital synthesis circuit of the present invention can synthesize impedances with greater accuracy than conventional circuit elements because of the tolerances associated with those elements. Although, this can be dependent on the resolution of the ADC and the DAC as well as the precision in the arithmetic of the DSP. One application of the present invention is in data transmission circuits, such as those found in modems and network interface cards, where the impedances are matched in order to avoid signal reflection.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A circuit for digitally implementing a transfer function having an impedance which converts an input voltage to an output voltage, the circuit comprising:
   an input terminal pair for receiving the input voltage;
   an output terminal pair for presenting the output voltage; and
   a impedance synthesis circuit electrically connected between the input terminal pair and the output terminal pair for creating an impedance, wherein the impedance synthesizer comprises:
      a generator, wherein the generator receives the input voltage and produces a control voltage; and
      a current source for producing a current whose value is dependent on the control voltage such that the output voltage is presented on the output terminal pair.

2. A circuit as defined in claim 1, wherein the generator is a multiplier.

3. A circuit as defined in claim 2, wherein the multiplier multiplies the input voltage by a factor of one over the impedance of the transfer function.

4. A circuit as defined in claim 1, wherein the impedance synthesizer comprises a plurality of generators.

5. A circuit as defined in claim 1, wherein the current has a value approximately equal to the inverse of the impedance of the transfer function.

6. A circuit as defined in claim 1, wherein the generator is a software procedure.

7. A circuit as defined in claim 1, wherein the impedance synthesizer further comprises an analog to digital converter for converting the input voltage to a digital voltage.

8. A circuit as defined in claim 1, wherein the impedance synthesizer further comprises a digital to analog converter for converting the control voltage to its analog equivalent.

9. A circuit as defined in claim 1, wherein the current source comprises a voltage controlled current source.

10. An impedance synthesis circuit for creating an impedance of a transfer function, the circuit comprising:
    a means for determining an input voltage;
    a means for multiplying the input voltage by 1/Z to produce a base voltage, where Z is the impedance of the transfer function; and
    a current source for generating a current between the input voltage and an output voltage, wherein the current source is controlled by the base voltage, wherein the impedance of the transfer function is created between the input voltage and the output voltage.

11. A circuit as defined in claim 10, wherein the current source generates a shunt current.

12. A circuit as defined in claim 11, wherein the current has a value equal to the inverse of the impedance of the transfer function.

13. A circuit as in claim 10, wherein the means for determining the input voltage further comprises an analog to digital converter.

14. A circuit as in claim 10, wherein the means for multiplying the input voltage further comprises a generator.

15. A circuit as in claim 14, wherein the generator is implemented in software and is capable of multiplying the input voltage by a plurality of values.

16. A circuit as in claim 10, further comprising a digital to analog converter for converting the base voltage to an analog equivalent.

17. A circuit for synthesizing a transfer function having an impedance, the circuit comprising:

a current source connected between an input voltage and an output voltage, wherein the current source generates a current having a value approximately equal to the inverse of the impedance of the transfer function;

an analog to digital converter for sensing the input voltage and converting it to a digital value;

a generator for processing the digital input voltage;

a digital to analog convertor for converting the processed input voltage to an analog value, wherein the output of the digital to analog converter controls the current generated by the current source.

18. A circuit as defined in claim 17, wherein the digital to analog converter is electrically connected to the current source.

19. A circuit as defined in claim 17, wherein the generator is implemented in software.

20. A circuit as defined in claim 17 further comprising more than one generator.

21. A circuit as defined in claim 17, wherein the generator multiples the input voltage by a factor of 1/Z, where Z is the impedance of the transfer function.

* * * * *